United States Patent [19]

Henry

[11] Patent Number: 5,381,420
[45] Date of Patent: Jan. 10, 1995

[54] DECOUPLED SCAN PATH INTERFACE

[75] Inventor: Matthew R. Henry, Albuquerque, N. Mex.

[73] Assignee: Honeywell Inc., Minneapolis, Minn.

[21] Appl. No.: 173,393

[22] Filed: Dec. 22, 1993

[51] Int. Cl.$^6$ ............................................. G06F 11/28
[52] U.S. Cl. .................... 371/22.3; 371/22.5
[58] Field of Search ............................ 371/22.3, 22.5

[56] References Cited

U.S. PATENT DOCUMENTS 5,254,942 10/1993 D'Souza et al. ................ 371/22.3 X
5,329,471 7/1994 Swoboda et al. ............... 371/22.3 X

OTHER PUBLICATIONS

"IEEE Standard Boundary Scan 1149.1" by John Andrews, presented at Electro International Conference 1991, New York, pp. 522–527 (Apr. 16–18, 1991).
"JTAG Works to Standardize Chip, Board and System Self-Test" by Warren Andrews, Technology Updates, *Computer Design*, pp. 28–31 (Jul. 1, 1989).
"Scan-Design Methods Increase Testability of Standard Cells" by Mark A. Buchanan, *Computer Design*, pp. 79–82 and 84 (Mar. 1, 1986).
"An Intuitive Look at Metastability" by Byron I. Moyer, *Electronic Engineering Times*, p. 37 (Mar. 9, 1992).

*Primary Examiner*—Edward R. Cosimano
*Attorney, Agent, or Firm*—Ronald E. Champion; Mark L. Becker

[57] ABSTRACT

An interface to internal scan paths within an IC for synchronizing a test clock and a system clock without adversely affecting their operation. The test clock provides input test data (TDI) to the interface and receives output test data (TDO) from the interface at the test clock rate. The system clock drives the test data through the scan path at the system clock rate. The two clocks are "decoupled" in that they run independently, being synchronized by the interface for clocking the test data into, through and out of the scan path. In effect, the interface decouples the internal scan paths driven by the system clock from the test logic driven by the test clock. This feature enables the IC to be tested "at speed" and provides for synchronization between the test clock and system clock over a wide range of test clock frequencies.

14 Claims, 3 Drawing Sheets

DECOUPLED SCAN PATH INTERFACE

TECHNICAL FIELD

This invention relates to methods and apparatus for testing digital electronic circuits in electronic systems, printed circuit boards, integrated circuits, or other assemblies. More particularly, this invention relates to a novel technique for interfacing a testing device with internal scan paths within an integrated circuit to permit complete testing of the circuit quickly and reliably.

BACKGROUND OF THE INVENTION

Historically, traditional methods of testing printed circuit boards (PCBs) have required physical contact of an array of test probes with pins of integrated circuit packages (ICs) mounted on the boards. This array of test probes, called a "bed-of-nails," tests interconnections on a board between ICs by forcing an output pin on an IC to a test value and then sampling an input pin of a connected IC to see if it received the test value. Bed-of-nails can also test internal paths within an IC by forcing input pins to test values and sampling the results at output pins for comparison against ideal results.

However, the bed-of-nails approach does not work for surface mounted devices (SMDs) or VLSI circuits that have minimal spacing between pins. SMDs are mounted directly to the surface of the PCB and do not have pins that extend through the board for a probe to contact. Moreover, SMDs are often mounted on both sides of the board, further complicating testing of the IC. VLSI circuits can have as little as 15 thousandths of an inch between pins, making it virtually impossible to attach a probe to a pin.

In response to the need for an all-electronic approach to testing, the industry has developed a standard test architecture known informally as the JTAG standard and formally as the IEEE 1149.1 standard. This standard test architecture supports board-level testing using a bus that connects to boundary-scan test logic in each IC. The term "boundary scan" means that the input and output pins (I/O pins), or boundaries, of the IC may be stimulated/monitored electronically during a test. The test logic includes boundary scan registers for allowing test data to be electronically placed on an output pin or to be observed on an input pin without the need for physical contact by a probe. It also includes a test access port (TAP), within the IC which serves as an interface between test data registers (such as a boundary scan register) on the IC and the bus. However, the JTAG standard goes further. It includes permission for users to add and access other scan registers, or scan paths, within an IC to test the internal operation of the IC. This is a powerful option, since it addresses a common need to provide for the complete testing of integrated circuit embedded within an assembled electronic system.

The common approach for testing ICs that comply with the JTAG standard and provide access to internal scan paths is to temporarily substitute the JTAG test clock for the IC's normal system clock during testing of the internal scan path. The test clock "drives" the internal scan path during test and the system clock drives the scan path during normal operation. This switching between the two clocks is known as multiplexing and is easily done. However, there are several disadvantages to clock switching. First, the switching of clock signals raises risks of unreliable or false clocking and excessive clock slew, particularly for application-specific-integrated circuits (ASICs). Second, clock switching does not allow for "at-speed" testing. Instead, tests are executed at the test clock frequency, which is usually only a fraction of the system clock frequency in modern high-performance electronic systems. Unlike the system clock frequency, the test clock frequency is often constrained by such system-level concerns as high fan out clock distribution/skew and noise/susceptibility related to fast logic edge rates. And third, there is a growing demand, fueled by the advent of multi-chip module (MCM) technology, to test ICs at their maximum speeds before they are mounted in a module. Testing device limitations often make this testing of such ICs with the clock switching technique impractical.

An object of the invention, therefore, is to provide a method and apparatus for driving an internal scan path by a system clock during testing of the electronic system. Another object of the invention is to provide a flexible interface between JTAG or other test logic driven by a test clock and one or more internal scan paths driven by a system clock.

SUMMARY OF THE INVENTION

The invention provides an interface to internal scan paths within an IC which synchronizes the test clock and the system clock without adversely affecting their operation. The test clock provides input test data (TDI) to the interface and receives output test data (TDO) from the interface at the test clock rate. The system clock drives the test data through the scan path at the system clock rate. The two clocks are "decoupled" in that they run independently, being synchronized by the interface for clocking the test data into, through and out of the scan path. In effect, the interface decouples the internal scan paths driven by the system clock from the test logic driven by the test clock. This feature enables the IC to be tested "at-speed" and avoids the other disadvantages of the clock switching approach. Furthermore, in a preferred embodiment, the interface is versatile in providing synchronization between the test clock and system clock over a wide range of test clock frequencies.

DETAILED DESCRIPTION OF A PREFERRED EMBODIMENT

Design

Figure 1:
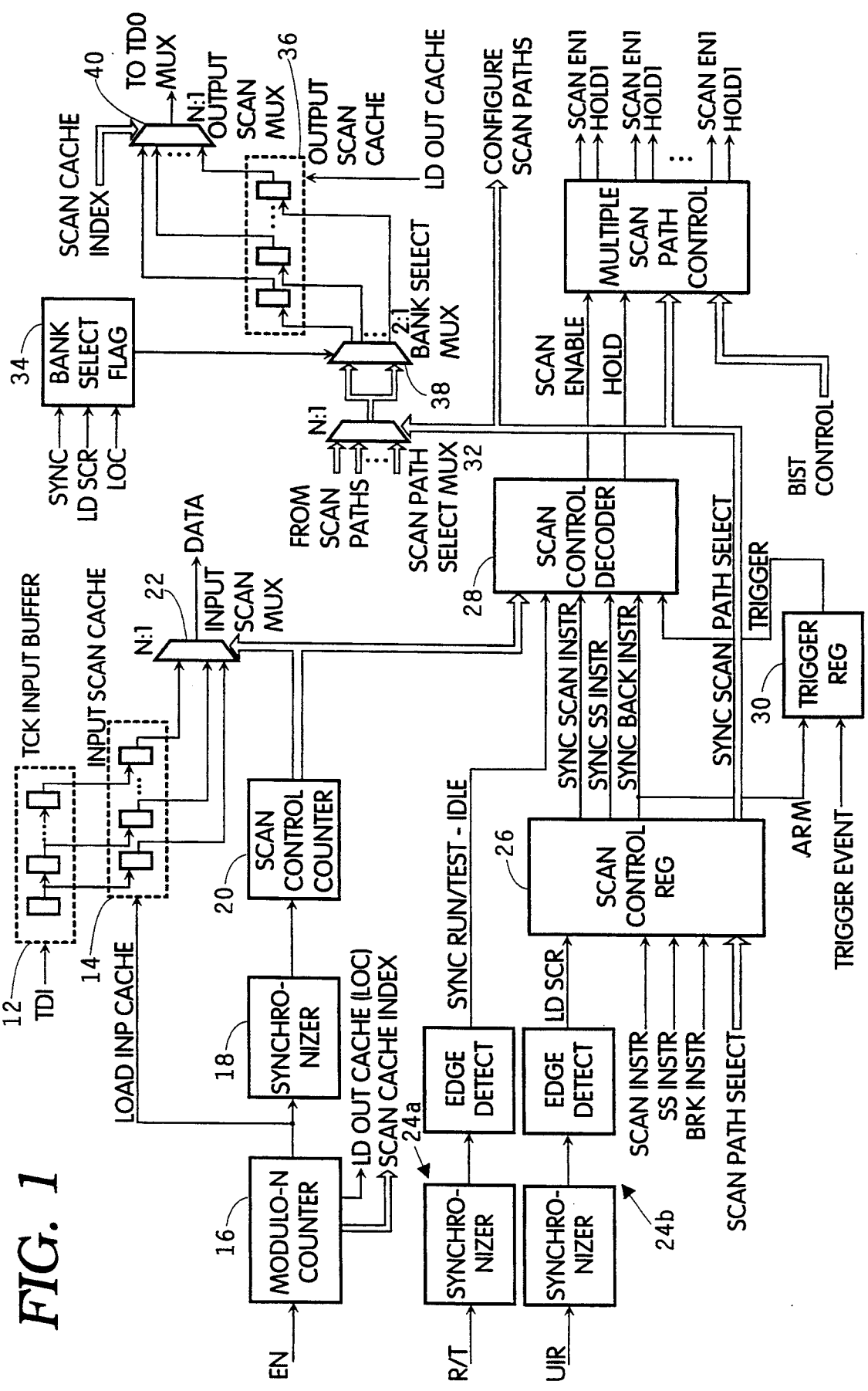
FIG. 1 is a block diagram of a scan path interface according to the invention.

FIG. 1 shows a scan path interface according to the invention, with input test data (TDI) from the test access port (TAP) entering at the left of the interface and output test data (TDO) exiting from the right. Input test data is clocked at the test clock (TCK) rate of a testing device into a data register such as an input buffer 12 that serially receives the data for temporary storage. The input buffer stores a predetermined number of bits of test data, depending on the buffer size. For convenience of description, the buffer 12 is said to hold N bits, where N can be any predetermined size. The buffer 12 is preferably of the type that can be filled serially and emptied in parallel. Thus to fill the input buffer from empty requires N cycles of the TCK.

Coupled to the input buffer 12 is another register such as an input scan cache 14 for receiving the input test data from the input buffer every N cycles of the TCK. The cache 14 is loaded in parallel with N bits of buffered input test data after every Nth rising edge of the TCK under the control of a modulo-N counter 16. The counter 16 counts TCK cycles and generates a Load Input Cache signal every N counts that, in turn, loads the cache 14 with the data in the buffer 12. The counter 16 also generates two other signals: a Load Output Cache signal and a Scan Cache Index signal. As will be seen, this multi-stage buffering synchronizes the input test data from TCK to system clock and back to TCK across N TCK periods.

The TCK and system clock are synchronized by the synchronizer 18, which receives as its input the Load Input Cache signal and outputs a synchronized Load Enable signal. The Load Enable signal controls a scan control counter 20 clocked by the system clock which advances the selected scan path N places after the input buffer 12 is copied into the input cache 14 and the Load Enable signal is removed. The counter 20 then asserts Scan Enable for N clocks while selecting bits from the cache 14 with an N:1 input scan multiplexer 22. After the scan path is advanced, the counter 20 asserts a Hold signal until the input cache is again loaded with input test data.

Test data from the scan path is resynchronized to the test clock through the output scan cache 36. The cache 36 holds serial output test data in groups of N bits and is parallel-loaded in concert with the loading of the input scan cache via the LD Out Cache signal. The output scan multiplexer 40 then selects one of the N cached bits for transfer to the test data out (TDO) stage of the JTAG interface. The multiplexer's select mechanism is a Scan Cache Index signal supplied by the counter 16 on every TCK tick. After the counter loads the output scan cache 36, it causes the multiplexer 40 to select one bit from the cache during each of the successive N clock ticks until all bits have been selected. The LD Out Cache signal is then again generated and the cache 36 is reloaded.

Tandem synchronizer/edge detectors 24a, 24b provide high reliability flags which are referenced to the system clock. Each time the TAP controller (not shown) traverses a "run/test-idle" state, the synchronizer/edge detector 24a causes the scan control decoder 28 to single-step the circuit, if applicable. That is, both the scan enable and hold signals are deasserted for one rising edge of the system clock, allowing the circuit to operate in its normal mode (instead of a test mode) for a single clock cycle. Each time the TAP controller traverses the "update instruction register" state, the synchronizer/edge detector 24b instructs the scan control register 26 to load the current decoded instruction signals that apply to scan testing.

The purpose of the scan control register 26, which is clocked by the system clock, is to interpret control signals which are relevant to internal scan operations. The state of these control signals is synchronized to the system clock. The following control signals may be used:

SCAN_INSTR Indicates that the current JTAG instruction references one of the internal scan paths.

SS_INSTR Indicates that the current JTAG instruction is a halt/single-step instruction (if applicable).

BRK_INSTR Indicates that the current JTAG instruction is a breakpoint instruction (if applicable).

TDR_SEL(Q:0) Allows the selection of one of M internal scan paths in combination with SCAN_INSTR.

The output of the synchronizer/edge detector 24a and scan control register 26 are routed to the scan control decoder 28 that also receives the output of the scan control counter 20. The decoder 28 generates the signals SCAN and HOLD, which provide control for internal scan paths. Depending on the type of current instruction, these signals may be controlled by a scan instruction, a halt/single step instruction or a trigger register 30 (breakpoint instruction). The trigger register 30, clocked by the system clock, allows the state of the IC under test to be frozen based upon a trigger event defined in the system. Trigger events may be defined by external strobes, state comparators, occurrence counters, or some combination of these conditions.

Most ICs under test will have designed into them a number of scan paths for testing different portions of the circuit design. The scan control register 26 thus receives a Scan Path Select signal from the testing device, synchronizes it to the system clock and routes it to a scan path select multiplexer 32. The multiplexer 32 selects the last 2N bits from one of the scan paths as determined by the register 26.

A bank select flag register 34 determines whether the last N bits or next-to-last N bits of the selected scan path are routed to an output scan cache 36. Which different N bits are selected is determined by the state of the scan. When beginning a new scan sequence, the last N bits must be selected for the output scan cache 36. However, for subsequent loads of the output cache, the internal scan path will lag the JTAG shift data by N stages; therefore, the next-to-last N bits are selected to maintain overall system synchronization. Synchronized Run/Test-Idle (evaluate scan path) and Load Scan Control Register (load new scan instruction) clear the bank select flag register 34 (select last N bits), while Load Output Cache sets the flag (select next-to-last N bits). The flag register 34, which is clocked by the system clock, applies its signal to a 2:1 bank select multiplexer 38 that selects either the last N or next-to-last N bits of the selected scan path to load into the output scan cache 36.

Operation

It is instructive to first consider a brute-force solution to synchronizing the test and system clocks that does not make use of the scan path caches 14 and 36. The goal is to shift one bit of test data through an internal scan path for each test clock cycle while accounting for the asynchronous relationship between the two clocks. The rising edge of TCK indicates that new test data is available at TDI. To synchronize the test clock to the system clock, one can use a two-stage, metastability hardened synchronizer which consumes the first two rising edges of the system clock after the rising edge of the test clock. On the third rising edge of the system clock, the scan path is advanced one stage.

After the scan path is advanced, a small amount of time must be allowed for the output of the scan path to propagate through data selection logic to set up at an output flip-flop that captures the scan data on the next rising edge of TCK. This time is referred to as delta, since it is small even in comparison to the system clock period. The one time period not accounted for is the uncertain interval between the rising edge of test clock and the next rising edge of system clock. We assume the worst case of one system clock period.

Figure 2:
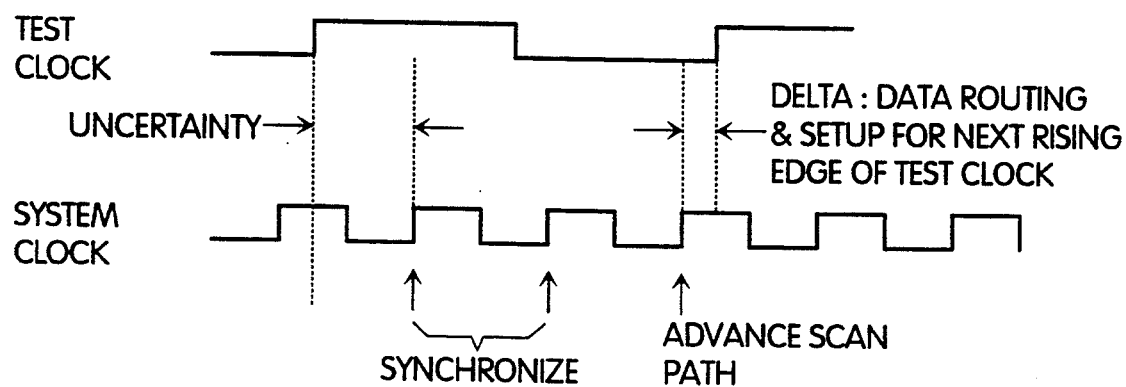
FIG. 2 is a timing diagram showing how the system clock synchronizes to the test clock.

FIG. 2 depicts this simplified scenario. It is evident from this figure that the test clock period must be at least as long as three system clock periods plus a delta in order to provide reliable operation. Therefore, the maximum test clock frequency is approximately one-third of the system clock frequency. Of course, shifting the internal scan path requires only one system clock cycle, but in this scenario we are incurring a three-clock penalty for synchronization and edge detection within a single test data shift.

Caching the test data in both TDI and TDO distributes this three-clock penalty across N test data shifts because the synchronization penalty is incurred only once for N bits of scan data. On the input side of the interface an N-bit shift register, designated as Input Buffer 12 in FIG. 1, accepts serial test data input on each rising edge of TCK clock. On every Nth clock cycle the contents of this shift register 12 are copied into a N-bit input scan cache register 14. The contents of this register can be held static until another N cycles of test clock transpire. The modulo-N Counter 16 determines when to load the input scan cache 14; this counter is enabled to count on the rising edge of test clock only during internal scan instructions in the Shift-DR TAP controller state.

The signal which loads the input scan cache 16 now becomes the test clock reference which must be synchronized to the system clock (instead of test clock itself, in the simplified case considered above). Once the load enable is synchronized and edge-detected, it enables the scan control counter 20 to advance the internal scan path N stages at the system clock rate. During each shift of the internal scan path, the scan control counter 20 also selects the scan input bit from the input scan cache 14 via the input scan multiplexer 22.

On the output side of the interface the last N bits from the internal scan path are copied in parallel to the output scan cache 36 at the same time that the N bits in the input buffer 12 are copied to the input scan cache 14. Therefore, during the subsequent N test clock cycles, the modulo-N Counter 16 also selects the appropriate bit from cache 36 via the output scan multiplexer 40 to serve as the test data output (TDO) for the IC.

There is an additional wrinkle in the operation of the output scan cache 36, however. During the first set of N test data shifts after a new internal scan instruction has been loaded or after the scan path has been "evaluated" (operated in normal mode for a single system clock cycle), the next N data bits lie in the last N bits of the internal scan path. But during subsequent sets of N test data shifts, the next N data bits lie in the next-to-last N bits of the internal scan path. The reason for this effect is that the position of the internal scan path is always behind that of the JTAG test data path at the instant that the caches are loaded. After the caches are loaded and synchronization occurs, the internal scan path races to catch up. The combination of the bank select flag/bank select multiplexer 38 accounts for this wrinkle.

Figure 3:
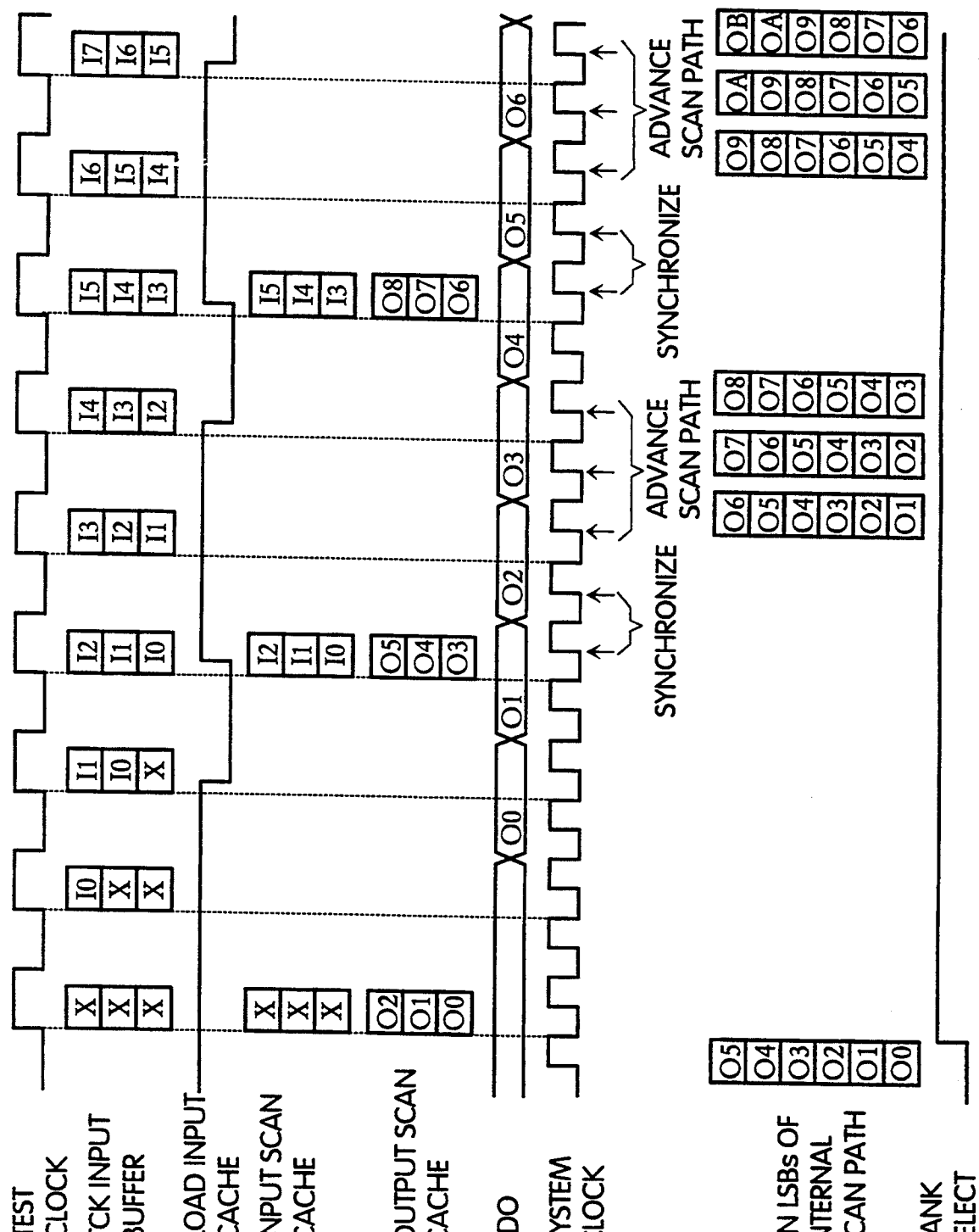
FIG. 3 is a timing diagram showing the operation of the interface of FIG. 1.

The systolic nature of the invention's operation is depicted in detail in FIG. 3. The edge-detection step is omitted in this figure, since it is often possible to absorb this step into the finite state machine logic which advances the scan path. This least significant bit of the test data output stream is designated as O0, while the least significant bit of the test data input stream is designated as I0.

FIG. 3 illustrates that the three-clock penalty for synchronization now occurs across N TCK clock cycles. Again neglecting the delta propagation times, we now have an equation which specifies the minimum clock period for TCK relative to that of the system clock:

$$PTCK = \frac{(3 + N) PCLK}{N}$$

where PTCK is test clock period,
N is the length of the scan cache, and
PCLK is the system clock period.

As N increases, the minimum period for PTCK approaches PCLK. The choice of N should be derived from the minimum projected system clock frequency and the maximum project test clock frequency. There is no limitation on the maximum period of TCK relative to the system clock period.

The way in which test data shifts in and out of an internal scan path has been described, but to execute scan-based testing the scan-path must also be evaluated. There are a few possible mechanisms for doing this.

In one approach, the scan path may be evaluated whenever the TAP controller enters the Run/Test-Idle state and an internal scan instruction is current. This approach, which is depicted in FIG. 1, does not generally provide for at-speed testing of the internal IC logic.

In order to support at-speed testing, the internal scan path must be evaluated during the system clock cycle immediately following the last data shift which fills the scan path. Per IEEE 1149.1, the test controller moves from the Shift-Dr state to the Exit1-Dr state on the rising edge of TCK at which the last bit of scan data is shifted into the device. By the time the last N bits have been shifted through the selected internal scan path, it can be determined that the JTAG TAP controller is no longer in the Shift-DR state. Therefore, with added control logic, the invention can evaluate the scan path on the clock cycle immediately following the last scan shift. A special JTAG "At-speed test" instruction should be designated to support this operation, however, since it relies on a scan sequence that is uninterrupted by a pause interval.

There are two notable side effects associated with applying this invention. The first is the length of the internal scan path: it should be a multiple of N in order to maintain the synchronization between internal and external scan paths. If the natural length of an internal scan path does not happen to coincide with a multiple of N, the user may pad the scan path with dummy scan register stages to reach the next multiple.

The second side effect is more significant, although it can be viewed also as a significant benefit in the test/debug environment. All internal storage elements must have some control mechanism by which they hold their current contents. While a JTAG internal scan instruction is current, the internal scan path advances in bursts of N cycles. During system clock cycles in which the scan path does not advance, it must be frozen in its current state to prevent corruption of the test.

A simple example of a hold mechanism is the load enable on a register. A more subtle example is an up-counter with a carry-in signal. Inhibiting the carry-in is functionally equivalent to the hold function. It is important to note that the hold logic need not be a dedicated resource which must be added to the logic design; it is important only that a global hold signal qualify any natural hold mechanisms which exist in the application logic.

The benefit provided by the hold proviso is that it allows a global halt/single-step capability to be added to the IC design. Using dedicated JTAG instructions and/or specialized trigger logic, the hold and scan enable signals can be interactively controlled to halt the state of the IC on a given condition (internal or external), to inspect the IC's internal contents without disturbing them, to selectively modify the IC's contents, or to single-step the IC through a given set of operations. This final capability is particularly attractive in the design of processing elements. Therefore, the invention inspires an overall on-line test and diagnostic environment for integrated circuits.

This invention has been described herein in considerable detail in order to comply with the Patent Statutes and to provide those skilled in the art with the information needed to apply the novel principles and to construct and use such specialized components as are required. Having illustrated and described the principles of the invention in a preferred embodiment, it should be apparent to those skilled in the art that the invention can be modified in arrangement and detail without departing from such principles. For example, discrete or integrated circuits of various types and depths of integration may be employed for the various parts of the interface, as is known to those of skill in the art. Such circuits could also be implemented in programmable or standard logic devices. Features of the invention shown in hardware may also be implemented software.

Therefore, the illustrated embodiment should be considered only as a preferred example of the invention and not as a limitation on the scope of the claims. I therefore claim as my invention all modifications and equivalents to the illustrated embodiment coming within the scope and spirit of following claims.

The embodiments of the invention in which an exclusive property or right is claimed are defined as follows:

1. A scan path interface circuit for interfacing a testing device to an electronic system for testing the electronic system, comprising:
   an input buffer for serially receiving input test data from the testing device for temporary storage, the buffer clocked at a test clock rate of the testing device;
   an input cache for receiving the input test data in parallel from the input buffer every Nth count of the test clock;
   an input multiplexer for serially clocking the input test data from the input cache through a scan path in the electronic system at a system clock rate of the electronic system to produce output test data;
   an output cache for receiving the output test data from the scan path in parallel every Nth count of the test clock; and
   an output multiplexer for serially clocking the output test data from the output scan cache to the testing device at the test clock rate.

2. The interface circuit of claim 1 wherein the input buffer includes at least N storage locations, and the input cache is clocked to receive N bits of test data in parallel from the input buffer every Nth count of the test clock.

3. The interface circuit of claim 1 wherein the input buffer is coupled to a test access port for receiving input test data from the port.

4. The interface circuit of claim 1 including a counter for generating a cache load signal every Nth count of the test clock for simultaneously loading the input cache with input test data and the output cache with output test data.

5. The interface circuit of claim 1 including a scan control register for selecting which of a number of scan paths in the electronic system receives the input test data.

6. The interface circuit of claim 1 including a scan control decoder for generating scan and hold signals to control movement of the test data through the scan path in such a way that the test clock and system clock remain synchronized.

7. The interface circuit of claim 1 wherein the test clock and the system clock operate at different clock rates.

8. The interface circuit of claim 1 wherein the input buffer includes N memory locations for temporarily storing N bits of input test data and the scan path has a length that is a multiple of N.

9. A method for interfacing a testing device to an electronic system for testing the electronic system, comprising:
   serially receiving input test data from the testing device for temporary storage at a test clock rate of the testing device;
   caching the stored input test data in parallel every Nth count of the test clock;
   serially clocking the cached input test data through a scan path in the electronic system at the system clock rate to produce output test data;
   caching the output test data from the scan path in parallel every Nth count of the test clock; and
   serially clocking the cached output test data to the testing device at the test clock rate.

10. The method of claim 9 including generating a cache load signal every Nth count of the test clock for simultaneously loading an input cache with input test data and an output cache with output test data.

11. The method of claim 9 including selecting which of a number of scan paths in the electronic system receives the input test data.

12. The method of claim 9 including generating scan and hold signals to control movement of the test data through the scan path in such a way that the test clock and system clock remain synchronized.

13. The method of claim 9 wherein the test clock and the system clock operate at different clock rates.

14. A method for interfacing a testing device to an electronic system for testing the electronic system, comprising:
   serially receiving input test data from the testing device for temporary storage at a first clock rate;
   caching the stored input test data in parallel every Nth count of the first clock;
   serially clocking the cached input test data through a scan path in the electronic system at a second clock rate to produce output test data;
   caching the output test data from the scan path in parallel every Nth count of the first clock; and
   serially clocking the cached output test data to the testing device at the first clock rate.

* * * * *